United States Patent
Vuillermet et al.

(10) Patent No.: US 11,885,866 B2
(45) Date of Patent: Jan. 30, 2024

(54) AUTO-CALIBRATION FOR CORELESS CURRENT SENSORS

(71) Applicant: Allegro MicroSystems, LLC, Manchester, NH (US)

(72) Inventors: Yannick Vuillermet, La Motte-Servolex (FR); Loïc André Messier, Vanzy (FR); Simon E. Rock, Heidelberg (DE); Maxwell McNally, Manchester, NH (US); Alexander Latham, Harvard, MA (US); Andreas P. Friedrich, Metz-Tessy (FR)

(73) Assignee: Allegro MicroSystems, LLC, Manchester, NH (US)

( * ) Notice: Subject to any disclaimer, the term of this patent is extended or adjusted under 35 U.S.C. 154(b) by 0 days.

(21) Appl. No.: 17/804,647

(22) Filed: May 31, 2022

(65) Prior Publication Data

US 2024/0004016 A1 Jan. 4, 2024

(51) Int. Cl.
  *G01R 35/00* (2006.01)
  *G01R 15/20* (2006.01)
  *G01R 33/07* (2006.01)

(52) U.S. Cl.
  CPC ......... *G01R 35/005* (2013.01); *G01R 15/202* (2013.01); *G01R 15/207* (2013.01); *G01R 33/072* (2013.01)

(58) Field of Classification Search
  CPC .. G01R 35/005; G01R 15/202; G01R 15/207; G01R 33/072
  See application file for complete search history.

(56) References Cited

U.S. PATENT DOCUMENTS

| | | |
|---|---|---|
| 5,041,780 A | 8/1991 | Rippel |
| 7,816,905 B2 | 10/2010 | Doogue et al. |
| 8,447,556 B2 | 5/2013 | Friedrich et al. |

(Continued)

FOREIGN PATENT DOCUMENTS

| | | |
|---|---|---|
| CN | 112649645 A | 4/2021 |

OTHER PUBLICATIONS

U.S. Appl. No. 17/651,080, filed Feb. 15, 2022, Rock et al.
U.S. Appl. No. 17/695,193, filed Mar. 15, 2022, Messier et al.
U.S. Appl. No. 17/804,654, filed May 31, 2022, Messier, et al.

*Primary Examiner* — Alvaro E Fortich
(74) *Attorney, Agent, or Firm* — DALY, CROWLEY, MOFFORD & DURKEE, LLP (57) ABSTRACT

Auto-calibrating current sensor integrated circuits (ICs) are configured for mounting at a position relative to a conductor. The auto-calibrating current sensor ICs can include a plurality of magnetic field sensing elements disposed at different locations within the integrated circuit, respectively, and can be configured to measure a magnetic field produced by a current carried by the conductor. The auto-calibrating sensors can include an electromagnetic model of the IC and the conductor. The model can be operative to determine a magnetic field at points in space due to a given current in the conductor at a known location of the conductor from the IC, and also the inverse situation of determining an unknown current and/or location of the conductor based on measurements of a magnetic field at known locations in space due to an unknown current in the conductor. Related auto-calibration methods are also described.

19 Claims, 9 Drawing Sheets

(56) References Cited

U.S. PATENT DOCUMENTS

| | | | |
|---|---|---|---|
| 8,542,010 B2 | 9/2013 | Cesaretti et al. | |
| 8,604,777 B2 | 12/2013 | Doogue et al. | |
| 8,847,590 B2 | 9/2014 | Flock et al. | |
| 10,884,031 B2 | 1/2021 | Vuillermet et al. | |
| 11,150,273 B2 | 10/2021 | Liu et al. | |
| 11,226,382 B2 | 1/2022 | Augendre et al. | |
| 11,320,466 B1 | 5/2022 | Briano et al. | |
| 2015/0176962 A1* | 6/2015 | Kerdraon | G01D 5/145 |
| | | | 324/207.24 |
| 2021/0223292 A1* | 7/2021 | Liu | G01R 15/202 |
| 2021/0285794 A1 | 9/2021 | Briano et al. | |
| 2021/0293904 A1* | 9/2021 | Ostermann | G01R 33/07 |

\* cited by examiner

AUTO-CALIBRATION FOR CORELESS CURRENT SENSORS

BACKGROUND

Magnetic field sensors can be used in a variety of applications. In one application, magnetic field sensors can be used to detect a linear or angular position of an object. In another application, magnetic field sensors can be used to sense a rotation of an object. In still yet another application, magnetic field sensors can be used as current sensors for measuring an electrical current flowing in a conductor.

Some conventional electrical current sensors are configured for positioning near a current-carrying conductor to sense a magnetic field generated by the current through the conductor. The current sensors typically generate an output signal having a magnitude proportional to the magnetic field induced by the current through the conductor. Some conventional current sensors employ a ferromagnetic core to increase the magnitude of the magnetic field produced by the current flowing in the conductor. If no ferromagnetic core is used, the magnetic field is directly sensed, in which case the sensor may be referred to as a "coreless" current sensor.

Various magnetic sensing elements can be used within magnetic field sensors. For example, planar Hall effect elements and vertical Hall effect elements are known types of magnetic field sensing elements. A planar Hall effect element tends to be responsive to magnetic fields perpendicular to a surface of a substrate on which the planar Hall effect element is formed. A vertical Hall effect element tends to be responsive to magnetic fields parallel to a surface of a substrate on which the vertical Hall effect element is formed. Magnetoresistance elements are also known types of magnetic field sensing elements that are used for magnetic field sensors.

Electric current sensors such as described above are typically susceptible to significant errors in measurements for even very slight misplacement or misalignment of the magnetic field sensing elements.

SUMMARY

An aspect of the present disclosure includes an auto-calibrating current sensor integrated circuit (IC) configured for mounting at a position relative to a conductor. The auto-calibrating current sensor IC can include a plurality of magnetic field sensing elements disposed at different locations within the integrated circuit, respectively, and configured to measure a magnetic field produced by a current carried by the conductor; memory, which may include computer-executable instructions including an electromagnetic model of the current sensor IC and the conductor, and where the model is operative to determine a magnetic field at points in space due to a given current in the conductor; and a processor coupled to the memory and operative to execute the computer-executable instructions, the computer-executable instructions causing the processor to perform operations that may include: measuring the magnetic field at the different locations of the magnetic field sensing elements due to a current applied to the conductor when the current sensor IC is at a mounted position relative to the conductor; calculating a coupling factor between each magnetic field sensing element at its respective location and the conductor, where the coupling factor is indicative of a magnitude of magnetic field measured per unit of current in the conductor; calculating the current applied to the conductor; and calculating the position of the current sensor IC relative to the conductor. Other embodiments and examples of this aspect can include corresponding computer systems, apparatus, and computer programs recorded on one or more computer storage devices, each configured to perform the actions relating to operation of the current sensors.

Implementations may include one or more of the following features. The current sensor IC can be configured to calculate the position of the current sensor IC as a distance across an airgap between the conductor and the current sensor IC. The model can include the position and orientation of the magnetic field sensing elements of the integrated circuit relative to each other. The model may include a three-dimensional (3D) electromagnetic finite-element-method (FEM) model. The model may include a lookup table having coupling factor values corresponding to a range of distances between the integrated circuit and the conductor. The coupling factor values may include coupling factors for corresponding distances, respectively, for different linear combinations of the magnetic field sensing elements. A linear combination may include a differential measurement between two magnetic field sensing elements. The model may include a system of non-linear equations expressing a coupling factor based on one or more distances between the conductor and the integrated circuit. The processor can be configured to determine the coupling factors by interpolation between the non-linear equations. The non-linear equations may include polynomials. The polynomials can each express a coupling factor between the conductor and one of the magnetic field sensing elements as a function of a distance between the integrated circuit and the conductor.

Each of the plurality of magnetic field sensing elements can have an axis of maximum sensitivity. One or more of the magnetic field sensing elements can be configured such that the axis of maximum sensitivity is perpendicular to a planar surface of the IC. One or more of magnetic field sensing elements can be configured such that the axis of maximum sensitivity is parallel to a planar surface of the IC. The plurality of magnetic field sensing elements may include one or more hall effect elements. The plurality of magnetic field sensing elements may include one or more magnetoresistance elements. The plurality of magnetic field sensing elements may include one or more fluxgate elements. The processor can be configured to realize linear combinations of the magnetic field measurements from the plurality of magnetic field sensing elements. The IC may include a first IC and may include a second IC separate from the first IC, where the second IC includes a second plurality of magnetic field sensing elements disposed at different positions, respectively, and configured to measure a magnetic field produced by a current carried in the conductor. Implementations of the described techniques may include hardware, a method or process, or computer software on a computer-accessible medium.

Another aspect of the present disclosure includes a method of calibrating a current sensor configured for mounting at a position relative to a conductor. The method can be used for a current sensor having an integrated circuit including a processor and a plurality of magnetic field sensing elements disposed at different locations within the integrated circuit. The method can include measuring, at each respective location of the plurality of magnetic field sensing elements, a magnetic field generated by a current applied to a conductor, where the integrated circuit is at a mounted position relative to the conductor; with the processor, using an electromagnetic model of the integrated circuit and the conductor to calculate a coupling factor between each magnetic field sensing element at its respective location and the conductor; with the processor, calculating the current applied to the conductor; and with the processor, calculating the position of the integrated circuit relative to the conductor. Other embodiments and examples of this aspect can include corresponding computer systems, apparatus, and computer programs recorded on one or more computer storage devices, each configured to perform the actions of the methods.

Implementations may include one or more of the following features. The method where calculating the applied current may include using the electromagnetic model to determine the applied current. The electromagnetic model may include a lookup table relating each of the coupling factors to a position of the integrated circuit relative to the conductor. The electromagnetic model may include a finite-element method (FEM) model relating each of the coupling factors to a position of the integrated circuit relative to the conductor. The electromagnetic model may include a system of non-linear equations expressing a coupling factor between respective magnetic field sensing elements and the conductor based on a distance between the conductor and the integrated circuit. Calculating a coupling factor for each magnetic field sensing element may include determining the coupling factor by interpolation between the non-linear equations. The non-linear equations may include polynomials. A number of unknown variables, N, of the model may be calculated, based on M linearly independent measurements by the plurality of magnetic field sensing elements, wherein M is N. Implementations of the described techniques may include hardware, a method or process, or computer software on a computer-accessible medium.

One further aspect includes a method of calibrating a current sensor configured for mounting at a position relative to a conductor. The current sensor can include an integrated circuit (IC). The method can include applying a calibration current having a profile with a calibration value to a conductor for calibration; with an integrated circuit including a processor and a plurality of magnetic field sensing elements disposed at different locations within the integrated circuit, measuring, at each respective location of the plurality of magnetic field sensing elements, a magnetic field generated by the applied calibration current in the conductor, where the integrated circuit is at a mounted position relative to the conductor; providing the calibration value of the calibration current to the processor; with the processor, calculating a coupling factor between each magnetic field sensing element at its respective location and the conductor; and with the processor, calculating the position of the integrated circuit relative to the conductor. Other embodiments and examples of this aspect can include corresponding computer systems, apparatus, and computer programs recorded on one or more computer storage devices, each configured to perform the actions of the methods.

Implementations may include one or more of the following features. The calibration current can include a specific current profile for triggering calibration of the current sensor. The specific current profile may include a first portion including a calibration pattern for triggering calibration of the current sensor and a second portion including the calibration value. The electromagnetic model may include number of unknown variables, N, which can be calculated, e.g., based on M linearly independent measurements by the plurality of magnetic field sensing elements, wherein M is N. The plurality of magnetic field sensing elements may include M magnetic field sensing elements. Implementations of the described techniques may include hardware, a method or process, or computer software on a computer-accessible medium.

A system of one or more computers can be configured to perform particular operations or actions by virtue of having software, firmware, hardware, or a combination of them installed on the system that in operation causes or cause the system to perform the actions. One or more computer programs can be configured to perform particular operations or actions by virtue of including instructions that, when executed by data processing apparatus, cause the apparatus to perform the actions.

The features and advantages described herein are not all-inclusive; many additional features and advantages will be apparent to one of ordinary skill in the art in view of the drawings, specification, and claims. Moreover, it should be noted that the language used in the specification has been selected principally for readability and instructional purposes, and not to limit in any way the scope of the present disclosure, which is susceptible of many embodiments. What follows is illustrative, but not exhaustive, of the scope of the present disclosure.

BRIEF DESCRIPTION OF THE DRAWINGS

The manner and process of making and using the disclosed embodiments may be appreciated by reference to the figures of the accompanying drawings. It should be appreciated that the components and structures illustrated in the figures are not necessarily to scale, emphasis instead being placed upon illustrating the principals of the concepts described herein. Like reference numerals designate corresponding parts throughout the different views. Furthermore, embodiments are illustrated by way of example and not limitation in the figures, in which.

DETAILED DESCRIPTION

The features and advantages described herein are not all-inclusive; many additional features and advantages will be apparent to one of ordinary skill in the art in view of the drawings, specification, and claims. Moreover, it should be noted that the language used in the specification has been selected principally for readability and instructional purposes, and not to limit in any way the scope of the inventive subject matter. The subject technology is susceptible of many embodiments. What follows is illustrative, but not exhaustive, of the scope of the subject technology.

Prior to describing examples and embodiments of the present disclosure some information is provided for context. For the typical operation of coreless current sensors relying on Hall effect elements, a current in a conductor induces a magnetic field, a component of which is measured by a first Hall effect element at a first location (B1), while a second Hall effect element at a different location measures a component of the magnetic field at the different location (B2). The difference in the magnetic field measurements of the two Hall effect elements can be used for determining the current. For the current measurement, a coupling factor (CF) can be defined as the link between the magnetic field measurements, e.g., a differential field, $\Delta B = B2 - B1$, and the current flowing in the conductor: $\Delta B = CF*I$. The distances (i) between the Hall effect elements, and (ii) between the Hall effect elements and the conductor, directly influence the current measurements.

The coupling factor is typically highly sensitive to the distance between a magnetic field sensing element(s) and the conductor. For example, in some cases, the coupling factor can experience a rate of change of 5% per 100 µm. Using that rate of change as an example, if the coupling factor (CF)=200 mG/A at a separation distance of 2 mm, then the coupling factor (CF) will be 25% lower at a separation distance of 2.5 mm (CF=150 mG/A). The coupling factor, and measurements based on it, thus can have a very high sensitivity to misplacement of magnetic field sensing elements relative to a nominal placement position. This high sensitivity to misplacement typically requires a manual calibration of the output of conventional current sensors once positioned for a current sensing application, e.g., mounted in front of a conductor. In the absence of a manual calibration, the current measurement can be highly inaccurate if the IC is not mounted precisely at the nominal position.

Referring to the previous example, the need for this typical calibration requirement can be illustrated. Using the noted coupling factor, if the sensor was mounted at the nominal position, with a separation distance of two (2) mm, and the differential field was measured as $\Delta B = 200G$, then the corresponding current in the conductor would be 1000 A. If, however, the separation distance is other than as for the nominal position, even slightly, then the resulting current measurement can be in significant error. For example, if the measured differential field ($\Delta B$) is still 200G, but the magnetic field sensing elements are actually at a separation distance of 2.5 mm instead of 2.0 mm, then the current would still be measured to be 1000 A (using the CF=200 mG/A) but the actual current would actually be 200/0.15=1333A. In other words, a sensor misplacement of just 0.5 mm would lead to a significant undermeasurement (only 75%) of the actual current in the conductor. Such a result could be potentially dangerous in some situations since many systems can fail when subject to a current much higher than expected, e.g., an electric vehicle utilizing an electrical motor inverter.

An aspect of the present disclosure is directed to and provides auto-calibrating (a.k.a., self-calibrating) current sensor integrated circuits (ICs) configured for mounting at a position relative to a conductor. The auto-calibrating current sensor ICs can also include a plurality of magnetic field sensing elements disposed at different locations within the integrated circuit, respectively, and can be configured to measure components of a magnetic field produced by a current carried by the conductor. The auto-calibrating sensors can include a model of the current sensor IC and the conductor. The model can be operative to determine a magnetic field at points in space due to a given current in the conductor at a known location of the conductor from the IC, and also the inverse situation of determining an unknown current and/or location of the conductor based on measurements of a magnetic field at known locations in space due to an unknown current in the conductor.

Figure 1:
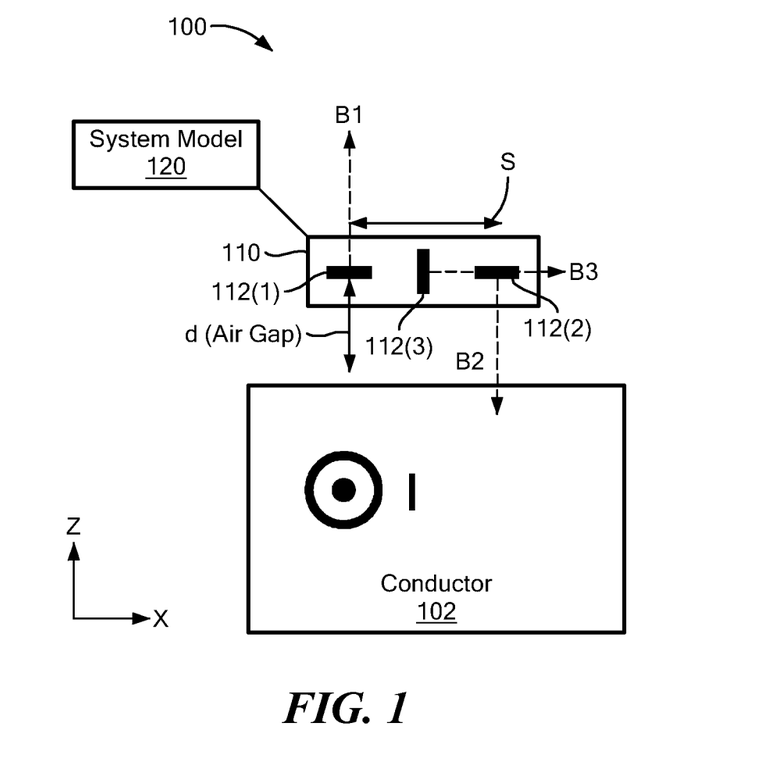
FIG. 1 is a diagram showing an example of an auto-calibrating integrated circuit (IC) current sensor, in accordance with the present disclosure.

FIG. 1 is a diagram showing an example of an auto-calibrating current sensor IC 100, in accordance with the present disclosure. Sensor 100 can include an integrated circuit 110 with a number (plurality) of magnetic field sensing elements 112(1)-(L) configured to sense current flow (I) in a conductor 102. System 100 may also include a system model 120, e.g., electromagnetic model, of the sensor 100 and the conductor 102. In some examples, IC 110 may further include other circuitry and components (not shown), e.g., one or more processors, memory, input/output (I/O) functionality, etc. The system model 120 can be stored in the memory and/or processor of the IC 110. In the figure, the positive X-axis is indicated extending laterally to the right, while the positive Z-axis is shown extending vertically; it will be understood that the positive Y-axis (not shown) is oriented normal to the plane of the figure and away from the viewer.

Three magnetic field sensing elements 112(1)-(3) are shown, with two magnetic field sensing elements 112(1)-(2) configured for differential measurement of a magnetic field in a first direction (indicated by oppositely oriented magnetic flux density vectors B1, B2) and one magnetic field sensing element 112(3) configured for single-ended measurement of a magnetic field in a second direction (indicated by magnetic flux density vector B3). While three magnetic field sensing elements are shown, different numbers of magnetic field sensing elements can be used in other embodiments and examples. The sensor 100 and conductor 102 can be separated by a separation distance "d" (indicated as "Air Gap"). In some examples, the separation distance "d" from the conductor 102 to the magnetic field sensing elements can be considered to be the same as that from the conductor 102 to the integrated circuit 110. Sensing elements 112(1)-(3) are at fixed positions relative to each other and the IC 110.

The model 120 can be used to calculate the magnetic field generated by the conductor 102 at any points in space—or at least at some relevant points in space—for any current in the conductor 102. From this model 120 and a measurement of the magnetic field generated by an arbitrary current (I) flowing in the conductor 102, the current sensor IC 100 is able to calculate its own position in space, e.g., across the air gap, relative to the conductor 102 and to calculate the coupling factor between the conductor 102 and each of its sensing elements. The IC 110, using the model 120, then calculates the inverse problem to derive the unknowns (the current and the IC position) from the known measurements.

As a reminder, the direct problem is when one calculates the effect from the source, while the inverse problem consists in deriving the source from the effect. In this case, the direct problem would be using the model 120 to calculate the magnetic field, at some positions, induced by a known conductor with a known current flowing through it; the inverse problem would include taking the magnetic field measurements at known locations, and using the model 120, deriving the current and the IC position (at a position across the air gap). To facilitate determining a solution, it may be preferred to have at least as many measurements from the magnetic field sensing elements 112(1)-(L) as the number of unknowns in the model 120 for which solutions are sought. In other words, given a number of unknown variables, N, of the model 120, those variables may be calculated based on M linearly independent measurements by the plurality of magnetic field sensing elements, wherein M is N. For example, if the unknown variables are the current (I), the position of the IC 110 across the air gap (AG), and the position of the IC 110 laterally in the X-direction, then in this case, the IC 110 would perform or take three independent measurements to derive the unknown variables.

The model 120 of the sensor 100 can be, for example, as complex as a 3D numerical AC electromagnetic model (for example based on the finite element method (FEM)) or as simple as a 1D look-up table (LUT). The selection of a particular format of the model may depend on multiple factors, e.g., available memory and/or available computation capability in the IC, ease of use of the model, etc. For some applications and examples, it may be simpler to program an IC with a look-up table than with a FEM model. Example implementations utilizing look-up tables (LUTs) are described below. In some examples, the model 120 can include one or more lookup tables (LUTs), functions, curves, and/or sets of data relating parameters of the system model. For example, in some embodiments, the model 120 can include, but is not limited to, a LUT relating coupling factors to distances.

Figure 2:
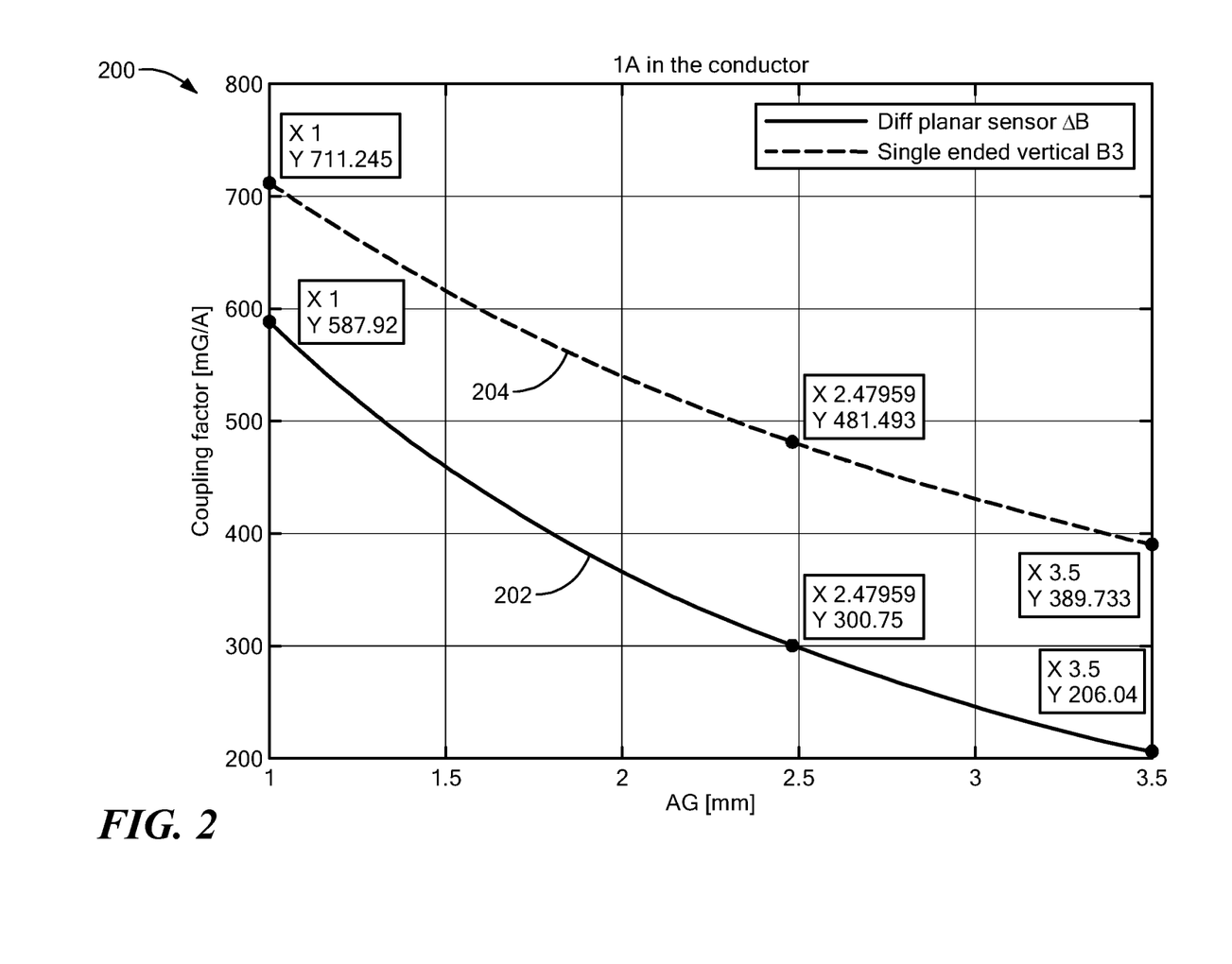
FIG. 2 is a diagram of an example plot of curves representing coupling factors vs. separation distance for current sensor autocalibration, in accordance with the present disclosure.

FIG. 2 is a diagram of an example plot 200 of curves representing coupling factors vs. separation distance for current sensor autocalibration, in accordance with the present disclosure. For the plotted data, the independent axis represents distance (in mm) across an air gap (AG) between the conductor and a current sensor IC, while the dependent axis represents coupling factor strength (in mG/Amp). Plot 200 includes curve 202 representing a differential planar magnetic field measurement ($\Delta B$), e.g., from magnetic field sensing elements 112(1)-(2) in FIG. 1. Plot 200 also includes curve 204 representing a single-ended magnetic field measurement (B) e.g., from magnetic field sensing element 112(3) in FIG. 1. Curves 202 and 204 indicate coupling factors for a current of 1 A. The plotted data for curves 202, 204 can be derived from simulations or measured on a reference set up corresponding to a given application of an auto-calibrating current sensor IC.

In an illustrative example, curves 202 and 204 can correspond to an implementation of a current sensor IC 100 as described for FIG. 1. As shown in FIG. 1, the current sensor IC 100 includes two planar Hall effect elements (taking measurements B1 and B2 along the Z axis) and one single vertical Hall effect element (taking measurement B3 along the X axis). As a result of the Hall effect element configuration, current sensor IC 100 measures $\Delta B$ and B3, which can correspond to curves 202 and 204, respectively.

For the example of FIG. 2, the IC 110 of current sensor 100 can be assumed to be (modeled as) perfectly centered above the conductor 102 along the X-direction. For calculation purposes, the conductor 102 can be considered to be an infinitely long conductor in the Y-direction (normal to the plane of the figure). It may also be assumed that there is no tilt of the IC 110 or the conductor. For this example, the IC 110 may be considered to only undergo translation along the Z-direction such that the position of the IC 110 can be located anywhere between an airgap (AG)=1 mm to an airgap (AG)=3.5 mm (inclusive of the endpoint positions).

The data from plot 200 contains the coupling factors for $\Delta B$ and B3 for points in space over the separation distance (air gap or "AG") between the IC 110 and the conductor 102. The data can be loaded in IC 110, e.g., in memory located in IC 110. Table 1, below, is a lookup table (LUT) listing data from FIG. 2 (some data are omitted for brevity):

TABLE 1

Look-up Table (LUT) corresponding to FIG. 2

| LUT_line | Air gap AG [mm] | $CF_{\Delta B}$ [MG/A] | $CF_{B3}$ [MG/A] |
|---|---|---|---|
| 1 | 1 | 588 | 711 |
| 2 | 1.1 | ... | ... |
| 3 | 1.2 | | |
| ... | 1.3 | | |
| | ... | | |
| n | 3.5 | 206 | 390 |

For an illustrative example, the IC 110 (FIG. 1) can be assumed to be mounted for an application at a current sensing position that is 2.48 mm from the relevant conductor (AG 2.48 mm). In this example, the application is one where an arbitrary current—selected to be 1000 A for ease of calculation—is flowing in the conductor 102. At this point, the IC 110 has not yet determined the actual current flowing in the conductor and would not know the airgap position. The IC would only be aware of the magnetic field values it measures: $\Delta B_{MES}$=300.8G and $B3_{MES}$=481.5G (see FIG. 2). At this initial time, the IC would know two data points ($\Delta B$ and B3) and would consequently need to calculate two unknowns, i.e., the airgap (AG) position and the current (I) in the conductor.

From LUT 1 (or the data in curves 202 and 204), the upper and lower limits (bounds) of the current can be determined. From the $\Delta B$ column of Table 1 and from the definition of the coupling factor: the current can be determined to be at least 300.8/0.588=511A and at most 300.8/0.206=1460 A. From the B3 column of Table 1 and from the definition of the coupling factor: the current can be determined to be at least 481.5/0.711=677A and at most 481.5/0.390=1235A. For this situation, the lower and upper limits of the single-sided field measurement column (B3) are within or between the corresponding limits provided by the differential field measurement ($\Delta B$) column. Thus, the current (I) is known to be between those two bounds, i.e., 677A≤I≤1235A. Accordingly, the lower and upper limits of the current can be defined as $I_{MIN}$=677A and $I_{MAX}$=1235A.

Various different algorithms can be used solve the inverse problem to determine the IC sensor position across the air gap AG and the current (I). The first and simplest idea is to walk through the look-up table (Table 1) and all currents in between $I_{MIN}$ and $I_{MAX}$ until the model output matches the measurements, e.g., as shown by algorithm 300 of FIG. 3.

Figure 3:
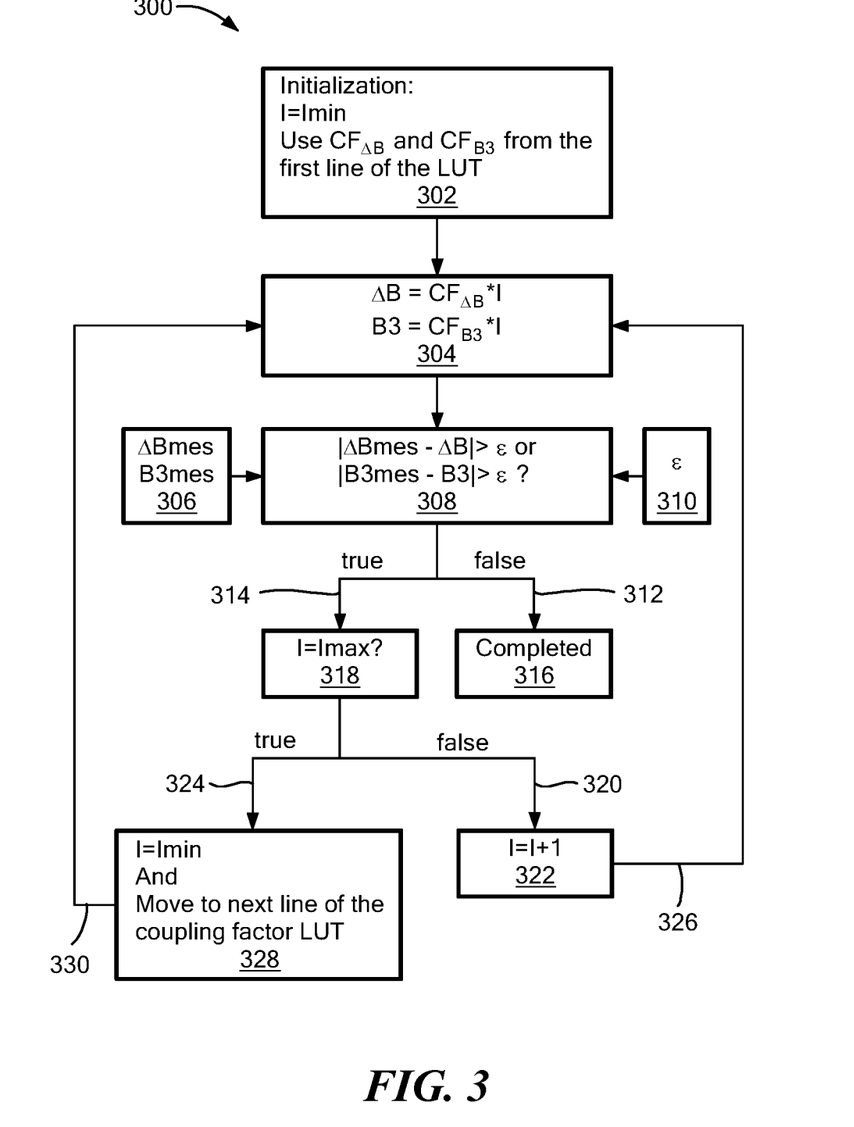
FIG. 3 is a diagram of an example auto-calibration algorithm for current sensor ICs, in accordance with the present disclosure.

FIG. 3 is a diagram of an example auto-calibration algorithm 300 for current sensor ICs, in accordance with the present disclosure. For algorithm 300, which may also be considered as a method or process, an initialization step 302 can include setting current (I) equal to $I_{MIN}$ and using the coupling factors ($CF_{AB}$, $CF_{B3}$) from the first line of Table 1. The corresponding field values, ΔB and B3, can be calculated from the present value of the current (I) for the given iteration of the algorithm 300, as described at 304. The measured field values (magnetic field measurements) $\Delta B_{MES}$ and $B3_{MES}$ can be obtained, as shown at 306, and compared to the present values of the field values ΔB and B3, as shown at 308, to determine whether either of the calculated fields values match or substantially match the corresponding measured field value within an arbitrary small error range value (ε), as selected or set at 310. If a false condition is determined at comparison 308, i.e., the difference between a measured field value $\Delta B_{MES}$ or $B3_{MES}$ is determined to be within the selected error range (ε) of the corresponding calculated field ΔB or B3, respectively, the algorithm 300 would stop and is considered completed, as shown at 316. From the present values of the field values ΔB and/or B3, the corresponding airgap (AG) from the LUT (Table 1) would be determined to be the airgap (AG) for the sensor 100 in its application. From the knowledge of the air gap (separation distance) and the coupling factor, and a field value, e.g., ΔB, the current can easily be calculated, e.g., $I=(\Delta B/CF_{AB})$.

In the event a true condition is determined at comparison 308, the calculated current is compared to $I_{MAX}$, as shown at comparison 318. If comparison 318 indicates that the calculated current is not equal to $I_{MAX}$, as shown at 320, then the value of I can be incremented, as shown at 322, and then the algorithm can return to calculate the field values, as shown at 326. If comparison 318 indicates that the calculated current is equal to $I_{MAX}$, as shown at 324, then the present value of the current can be set equal to $I_{MIN}$, as shown at 328; the algorithm 300 can then perform a new iteration starting at the next line in the lookup table, (e.g., line 2 in Table 1), as shown at 330.

The following in an example MATLAB implementation of algorithm 300:

Example MATLAB Code for Algorithm 300

ε=1;
i=1;
j=1;
$\Delta B=CF_{AB}(1)*I_{MIN}$;
$B3=CF_{B3}(1)*I_{MIN}$;
While $|\Delta B_{MES}-\Delta B|>\varepsilon$ or $|B3^{MES}-B3|>\varepsilon$
   i=i+1;
   $\Delta B=CF_{AB}(j)*(I_{MIN}+i)$;
   $B3=CF_{B3}(j)*(I_{MIN}+i)$;
   If $i==I_{MAX}-I_{MIN}$
     i=1;
     j=j+1;
   End
End At the completion of the shown MATLAB implementation of algorithm 300, the coupling factors of the current sensor IC (at the application position) are determined to be $CF_{AB}(j)$ and $CF_{B3}(j)$. The current flowing in the conductor is $I_{MIN}+i$. Note: $CF_{AB}(j)$ corresponds to the $j^{th}$ line of the look-up table (LUT). For faster convergence, in some examples, algorithm 300 may be implemented using the known bisection method algorithm (a.k.a., dichotomy principle). While an example of a MATLAB implementation of algorithm 300 is described above, algorithm 300 can of course be implemented in any other suitable programming language or script.

In addition to the use of LUTs as described above, another option is to solve a system of non-linear equations to determine the unknown current (I) and distance of the IC (e.g., across a range of air gaps) from the conductor. For example, the coupling factors $CF_{AB}$ and $CF_{B3}$ can be interpolated across the separation distance (air gap, AG) using, e.g., two polynomial functions that have been fit to collected or simulated data.

Figure 4:
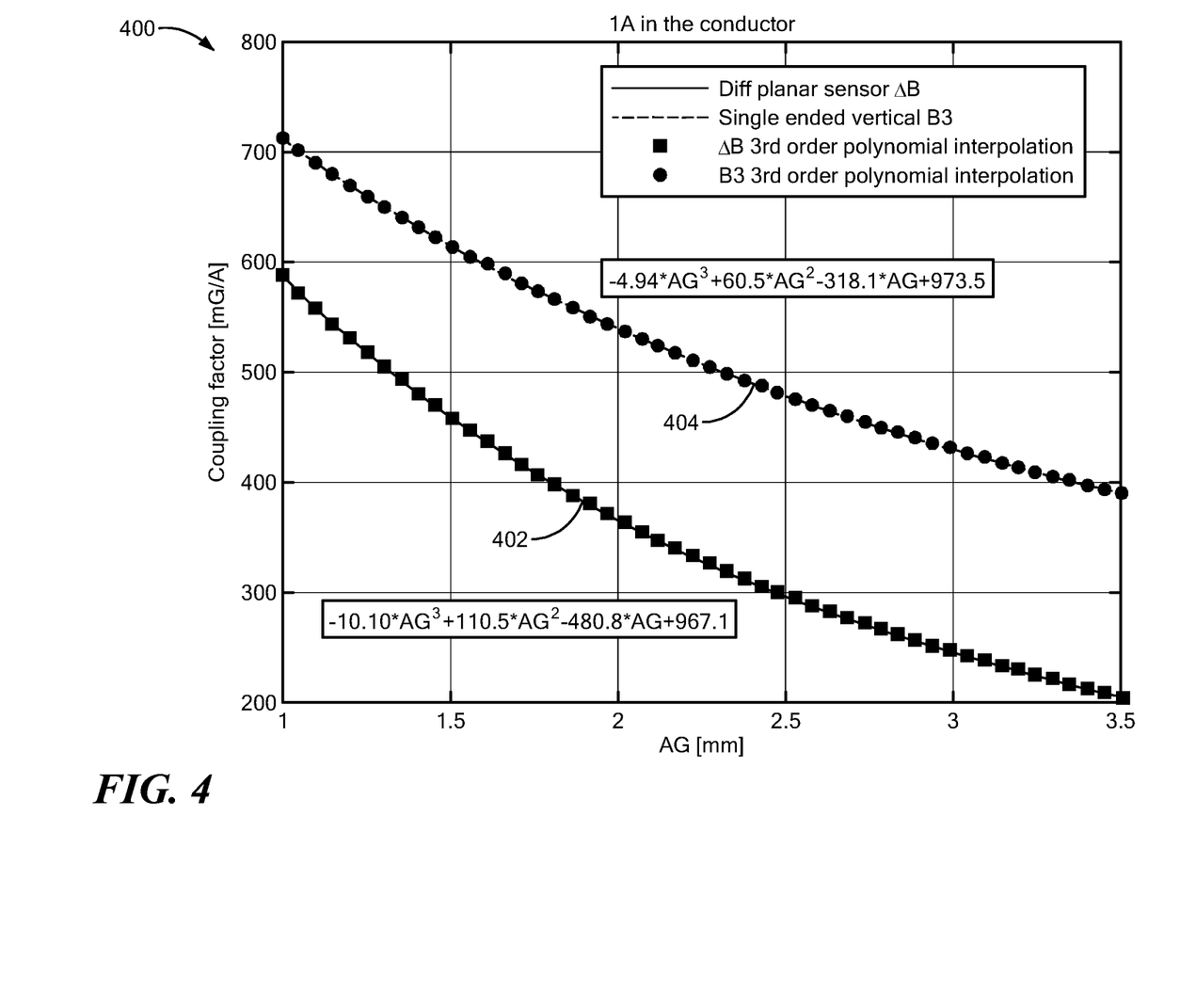
FIG. 4 is a diagram of an example plot of curves representing interpolated coupling factors vs. separation distance for autocalibration of current sensors, in accordance with the present disclosure.

FIG. 4 is a diagram of an example plot 400 of curves representing interpolated coupling factors vs. separation distance for autocalibration of current sensors, in accordance with the present disclosure. Curves 402 and 404 in FIG. 4 represent ΔB and B3 coupling factor (CF) values, respectively.

For example, generalized $3^{rd}$ order fitting polynomial functions would be:

$$CF_{AB}(AG)=a_1.AG^3+b_1.AG^2+c_1.AG+d_1 \quad (EQ.\ 1)$$

$$CF_{B3}(AG)=a_2.AG^3+b_2.AG^2+c_2.AG+d_2 \quad (EQ.\ 2)$$

Representative values of $a_1$, $b_1$, $c_1$, and $d_1$ are shown in FIG. 4 as −10.10, 110.5, −480.8, and 967.1, respectively. Representative values of $a_2$, $b_2$, $c_2$, and $d_2$ are shown in FIG. 4 as −4.94, 60.5, −318.1, and 973.5, respectively. It will of course be understood that other values of these noted constants can be used for other situations and applications. Furthermore, polynomials of different order (e.g., $4^{th}$, $5^{th}$, etc.) may be used as well.

To calculate the air gap (AG) distance and the current (I), the following system of two $3^{rd}$ order equations can be solved:

$$(a_1.AG^3+b_1.AG^2+c_1.AG+d_1) \cdot I-\Delta B_{MES}=0 \quad (EQ.\ 3)$$

$$(a_2.AG^3+b_2.AG^2+c_2.AG+d_2) \cdot I-B3=0 \quad (EQ.\ 4)$$

Using the values of the constants in EQS. 1-2, this system of equations (EQS. 3-4) can be solved to determine the current (I) and position (AG) using, e.g., a suitable classical non-linear solver such as Newton-Raphson algorithm, non-linear least square algorithm, Levenberg-Marquardt algorithm, or the like.

Another option for solving for the unknown current and/or position of an auto-calibrating current sensor IC is to use the ratio of the coupling factors, $r=CF_{AB}/CF_{B3}$. This ratio can be loaded in the sensor IC as a look-up table or as coefficients of a polynomial function, e.g., $r=\alpha.AG^3+\beta.AG^2+\gamma.AG+6$. Either of the coupling factors, $CF_{AB}$ or $CF_{B3}$, could also be loaded (as a look-up table or a polynomial function). In some examples, the differential field coupling factor $CF_{AB}$ would be loaded in addition to the CF ratio, r.

The CF ratio (r) would then be compared to the measured ratio $r_M=\Delta B/B3$: the air gap AG corresponding to $r=r_M$ would be the air gap (distance from the conductor) at which the IC is mounted in the particular application. From the knowledge of the air gap (separation distance), the coupling factor at the air gap, and a corresponding field value, e.g., ΔB, the current can easily be deduced: $I=(\Delta B/CF_{AB})$.

While one configuration of magnetic field sensing elements is shown and described for current sensor IC 100 of FIG. 1, multiple alternative configurations of sensing elements can be used within the scope of the present disclosure. For whatever configuration is implemented, each resulting field measurement that is used with the model should be linearly independent of the other measurement(s) and there should be at least as many measurements as unknowns to be solved. For example, an auto-calibrating current sensor IC according to the present disclosure could be used in a particular application to detect the current in a conductor, the position across the air gap relative to the conductor, and also the placement (laterally) along the X-direction relative to the conductor. In this case, three measurements would be required (as opposed to the examples described above, where two measurements were used). For this case, the system model loaded in the IC would contain this additional unknown: the 1D look-up table from above examples would become a 2D look-up table. As noted previously, the measurements may be single-ended or differential.

Figure 5:
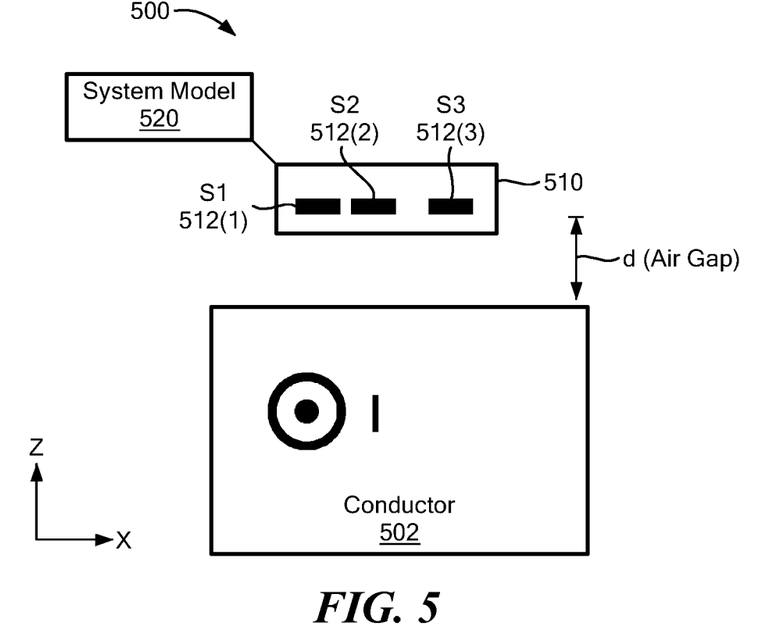
FIG. 5 is diagram of an example of an auto-calibrating current sensor IC having an alternate configuration of magnetic field sensing elements, in accordance with the present disclosure.
Figure 6:
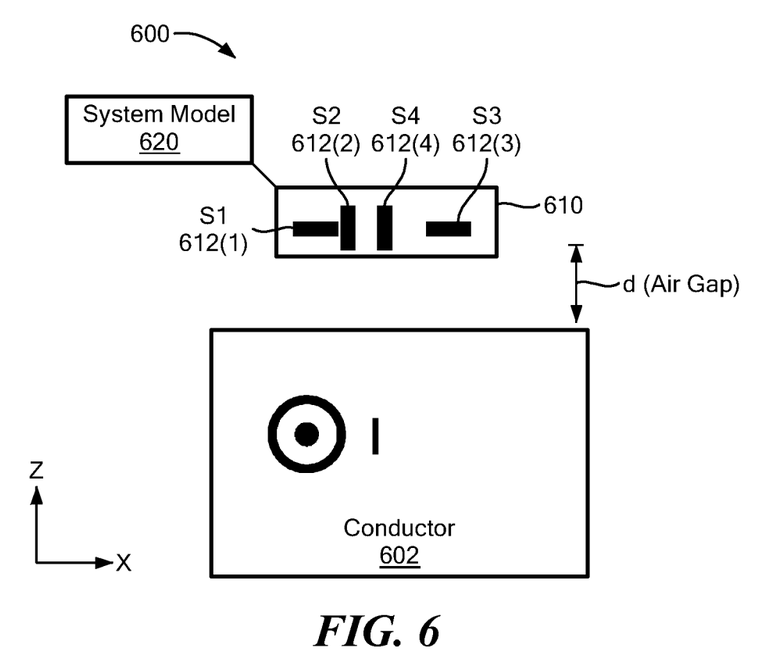
FIG. 6 is a diagram of a different example of an auto-calibrating current sensor IC with an alternate configuration of magnetic field sensing elements, in accordance with the present disclosure.
Figure 7:
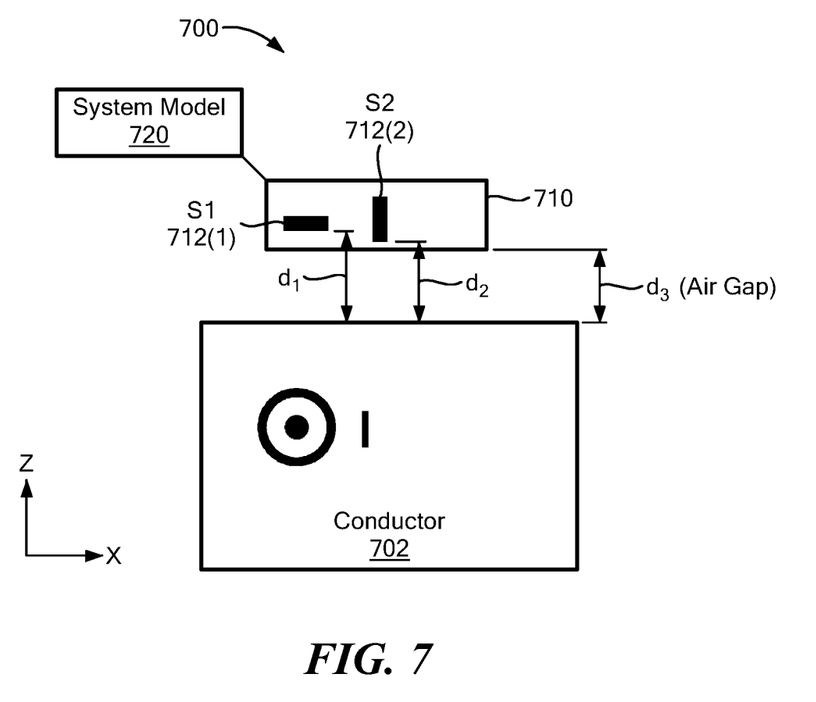
FIG. 7 is a diagram of another example of an auto-calibrating current sensor IC with an alternate configuration of magnetic field sensing elements, in accordance with the present disclosure.

Some examples of current sensor ICs having alternate sensing element configurations are shown in FIGS. 5-7. In FIGS. 5-7, a horizontal black rectangle denotes a magnetic field sensing element sensitive along the Z-direction while a vertical black rectangle is sensitive along the X-direction. The sensing elements can be of any suitable magnetic sensing technology, e.g., Hall effect, magnetoresistance (xMR), fluxgate, etc. The examples shown in FIGS. 5-7 are for two measurements, which could be used to solve for two unknowns; different sensing element configurations for two or more measurements may also be used within the scope of the present disclosure.

FIG. 5 is a diagram of another example of an auto-calibrating current sensor IC 500 with an alternate configuration of magnetic field sensing elements, in accordance with the present disclosure. current sensor IC 500 includes IC 510 having three sensing elements 512(1)-(3) (S1, S2 and S3) for measuring current in conductor 502. System model 520 is also included, as shown. In some examples (as shown), it may be preferable that sensing element 512(2) is not centered between sensing elements 512(1) and 512(3); otherwise, the resulting differential measurements using the elements would be symmetric and potentially linearly dependent. Two linearly independent differential measurements could be generated from the sensing element configuration: S3–S2 and S2–S1. Differential measurement S3–S1 could be used, e.g., instead of either of the S3–S2 or S2–S1 measurements in some examples.

FIG. 6 is a diagram of a different example of an auto-calibrating current sensor IC 600 with an alternate configuration of magnetic field sensing elements, in accordance with the present disclosure. Current sensor IC 600 includes IC 610 with four magnetic field sensing elements 612(1)-(4) (S1, S2, S3 and S4). System model 620 is also included. Two differential measurements could be generated, e.g., S3–S1 and S4–S2.

FIG. 7 is a diagram of a further example of an auto-calibrating current sensor IC 700 with an alternate configuration of magnetic field sensing elements, in accordance with the present disclosure. Current sensor IC 700 includes IC 710 with two sensing elements 712(1)-(2) (S1 and S2). System model 720 is also included. The two single-ended measurements can be used directly. In the figure, distances from the conductor 702 to the sensing elements 712(1)-(2) are indicated as $d_1$ and $d_2$, respectively. In some examples, depending on the configuration, e.g., aspect ratio, of IC 710, $d_1$ and/or $d_2$ can be considered as the airgap (AG) instead of the distance to the near (proximate) planar surface of the IC, shown as $d_3$. In some examples, distances $d_1$ and/or $d_2$ may be the same as $d_3$.

Examples of auto-calibration according to the present disclosure can be run at first start-up of a current sensor IC, e.g., sensor 100, once mounted for current measurement for a particular application at a position relative to a conductor. Such auto-calibration, however, may be run at other times and/or under other circumstances. For example, auto-calibration can also (or instead) be run at each start-up of the sensor IC, e.g., in the background. Or auto-calibration may be run from time to time during normal operation of the IC, e.g., in the background.

Running the auto-calibration in the background, without intruding on an externally-commanded current measurement, would help diagnose any issue in the sensor system. For example, if there were a mechanical failure, the sensor IC would be able to detect a change in air gap (separation distance) and raise a diagnostic flag. This diagnostic operation may serve to achieve a requirement for automotive applications in order to achieve a high ASIL (Automotive Safety Integrity Level) rating and/or advanced diagnostic of the current measurement.

In some examples, the sensor IC could also raise a flag and/or enter safe state if the auto-calibration algorithm fails to find a valid combination of air gap and/or current. Such a situation could happen if the air gap (AG) is, for example, larger than what is expected in the look-up table. Or if there is a large mismatch between the channels (sensing element measurement signal paths), e.g., due to a failure inside the sensor IC.

Another approach is to have the sensor IC loaded with the calibration current ($I_{CAL}$) it would see during the calibration, before mounting in a particular application for current measurement. Using such a pre-loaded $I_{CAL}$ value would remove one unknown and simplify the auto-calibration algorithm while also removing a need for one measurement. For example, referring to FIG. 5, the sensing element S2 can be removed and the only measurement in that case would be the S1–S3 differential measurement. This configuration may require a user to calibrate the sensor with a known current but can remove any need for the customer to program the sensor IC.

In some examples, to externally trigger a current sensor IC into an auto-calibration process, a current having a specially designed current pattern can be sent through the conductor, e.g., by a user/customer. The current pattern may have a specific profile and can include a combination of current level (amplitude) and timing (time profile) characteristics. An example of such a current pattern is shown in FIG. 8.

Figure 8:
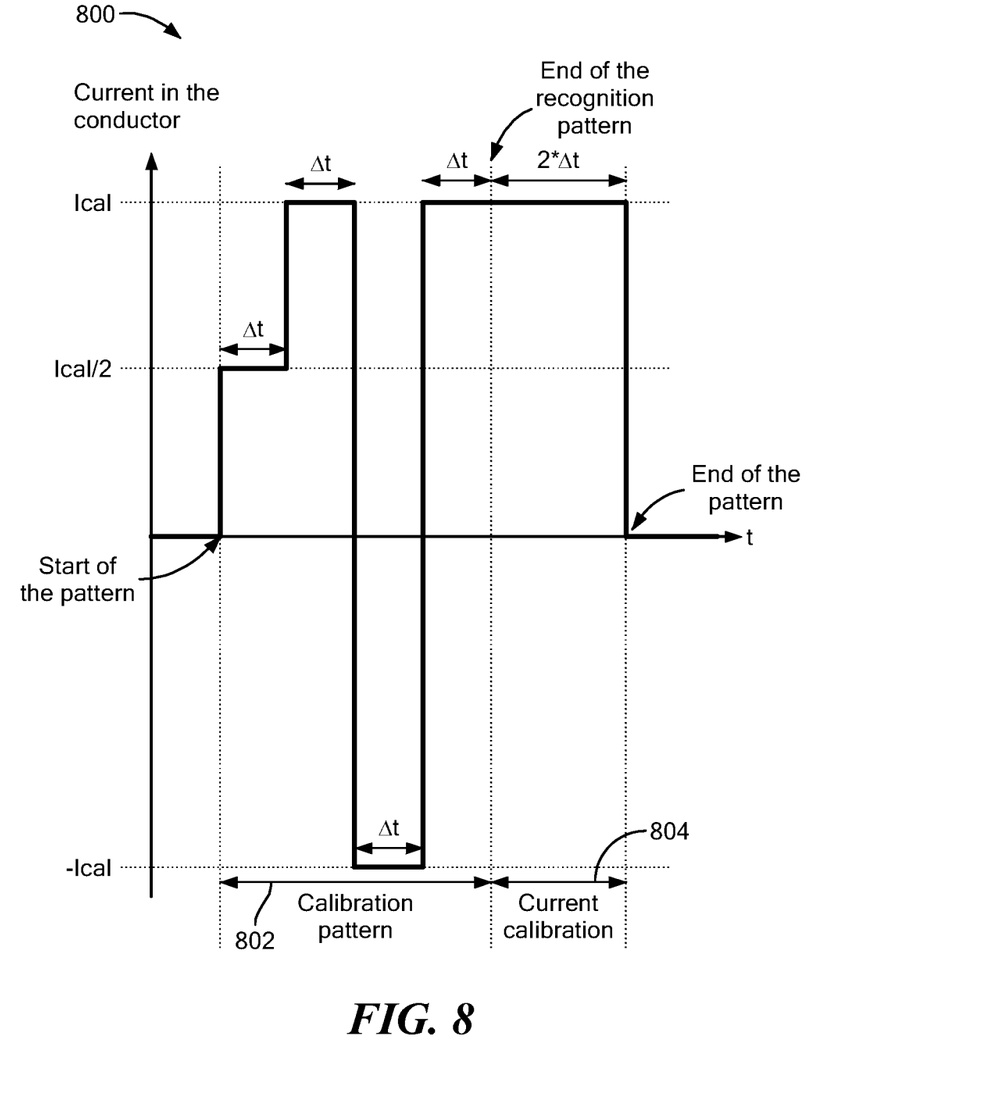
FIG. 8 is a graph of an example of a current pattern that can be used to trigger calibration of a current sensor IC, in accordance with the present disclosure.

FIG. 8 is a graph of an example of a current pattern 800 that can be used to trigger calibration of a current sensor IC, in accordance with the present disclosure. Current pattern 800 can include two (or more) components or portions including, e.g., a calibration pattern 802 and a calibration current 804. Each of the calibration pattern 802 and the calibration current 804 can have a number of predefined current levels (magnitudes), where each level can last for a predetermined time, e.g., one or more time periods ($\Delta t$).

The calibration pattern 802, which may also be referred to as a recognition pattern, can be used to trigger the IC calibration procedure for a particular current sensor IC. Once the calibration pattern 802 is ended, thus triggering the auto-calibration process for the sensor, the IC measures the magnetic field associated with the calibration current 804 ($I_{CAL}$). In some examples, the calibration pattern 802 can be selected, e.g., by the user, to have a relatively unique shape that would not typically be encountered during normal operation of the current sensor IC—to avoid inadvertently triggering the auto-calibration process. In some examples, the calibration pattern 802 can be loaded in the IC before installation for an application. In some other embodiments, a calibration pattern 802 can be downloaded or programmed after the current sensor IC is in an application position. While certain profiles are shown for each of the calibration pattern 802 and calibration current 804, other profiles may of course be used within the scope of the present disclosure.

Figure 9:
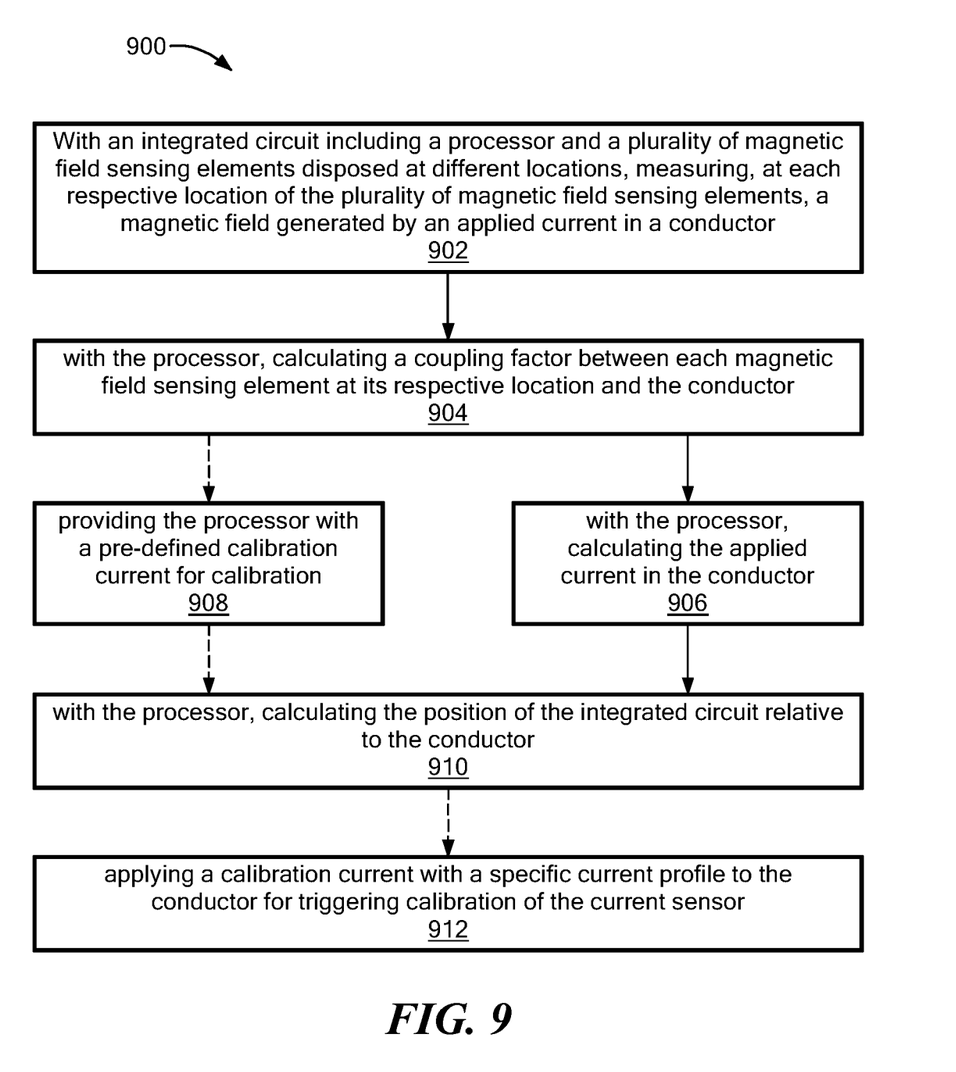
FIG. 9 is a is a block diagram of an example method of auto-calibration for a coreless current sensor, in accordance with the present disclosure.

FIG. 9 is a is a block diagram of an example method 900 of auto-calibration for a coreless current sensor IC, in accordance with the present disclosure. The coreless current sensor can include an integrated circuit with a processor, memory, and a plurality of magnetic field sensing elements disposed at different locations. The memory and/or processor may include a system model for the current sensor and a conductor. A magnetic field generated by an applied current in the conductor can be measured, at each respective location of the plurality of magnetic field sensing elements, as described at 902. Using the processor, a coupling factor can be calculated between the magnetic field sensing elements and the conductor, as described at 904. With the processor, the applied current can be calculated in the conductor, as described at 906. Alternatively, the processor may be provided with the value of a calibration current for calibration, as described at 908. The processor can be used to calculate the position of the integrated circuit relative to the conductor, as described at 910. In some examples, calibration current with a specific current profile can be applied to the conductor for triggering calibration of the current sensor, as described at 912.

Figure 10:
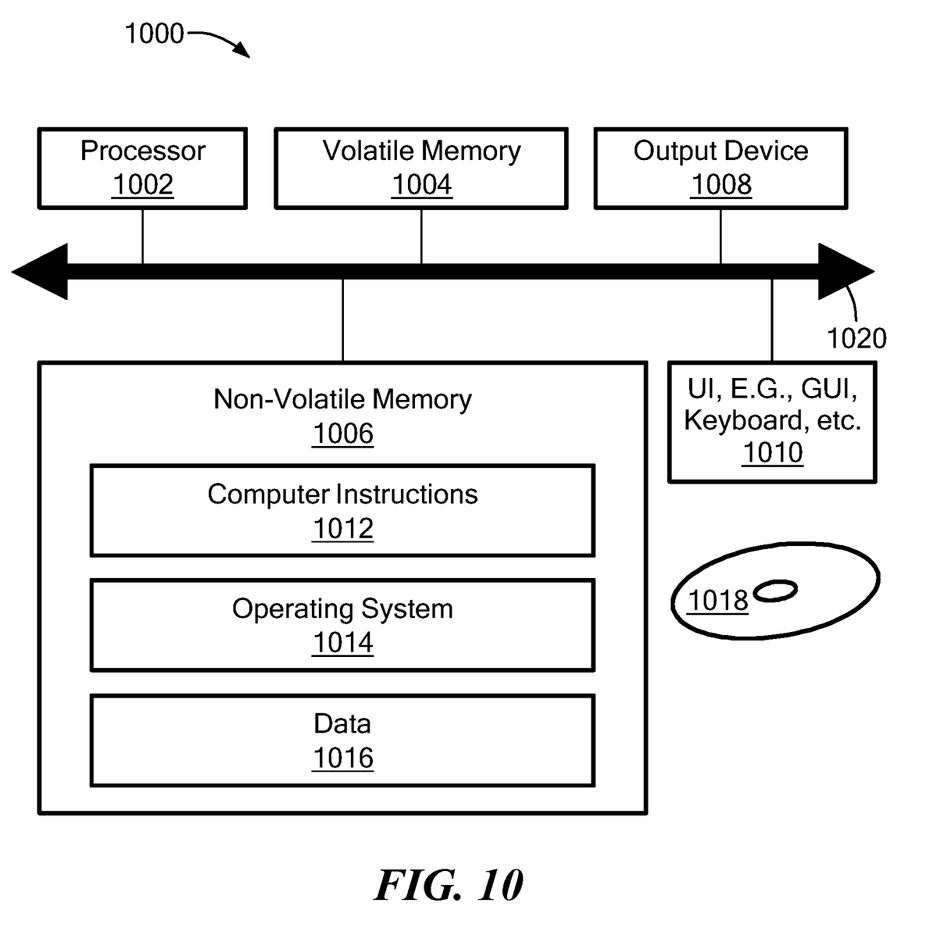
FIG. 10 is a block diagram of an example computer system operative to perform processing, in accordance with the present disclosure.

FIG. 10 is a block diagram of an example computer system 1000 operative to perform processing, in accordance with the present disclosure. Computer system 1000 can perform all or at least a portion of the processing, e.g., steps in the algorithms and methods, described herein. The computer system 1000 includes a processor 1002, a volatile memory 1004, a non-volatile memory 1006 (e.g., hard disk), an output device 1008 and a user input or interface (UI) 1010, e.g., graphical user interface (GUI), a mouse, a keyboard, a display, and/or any common user interface, etc. The non-volatile memory (non-transitory storage medium) 1006 stores computer instructions 1012 (a.k.a., machine-readable instructions or computer-readable instructions) such as software (computer program product), an operating system 1014 and data 1016. In one example, the computer instructions 1012 are executed by the processor 1002 out of (from) volatile memory 1004. In one embodiment, an article 1018 (e.g., a storage device or medium such as a hard disk, an optical disc, magnetic storage tape, optical storage tape, flash drive, etc.) includes or stores the non-transitory computer-readable instructions. Bus 1020 is also shown.

Processing may be implemented in hardware, software, or a combination of the two. Processing may be implemented in computer programs (e.g., software applications) executed on programmable computers/machines that each includes a processor, a storage medium or other article of manufacture that is readable by the processor (including volatile and non-volatile memory and/or storage elements), and optionally at least one input device, and one or more output devices. Program code may be applied to data entered using an input device or input connection (e.g., a port or bus) to perform processing and to generate output information.

The system 1000 can perform processing, at least in part, via a computer program product or software application, (e.g., in a machine-readable storage device), for execution by, or to control the operation of, data processing apparatus (e.g., a programmable processor, a computer, or multiple computers). Each such program may be implemented in a high-level procedural or object-oriented programming language to communicate with a computer system. However, the programs may be implemented in assembly or machine language. The language may be a compiled or an interpreted language and it may be deployed in any form, including as a stand-alone program or as a module, component, subroutine, or other unit suitable for use in a computing environment. A computer program may be deployed to be executed on one computer or on multiple computers at one site or distributed across multiple sites and interconnected by a communication network. A computer program may be stored on a storage medium or device (e.g., CD-ROM, hard disk, or magnetic diskette) that is readable by a general or special purpose programmable computer for configuring and operating the computer when the storage medium or device is read by the computer. Processing may also be implemented as a machine-readable storage medium, configured with a computer program, where upon execution, instructions in the computer program cause the computer to operate. Further, the terms "computer" or "computer system" may include reference to plural like terms, unless expressly stated otherwise.

Processing may be performed by one or more programmable processors executing one or more computer programs to perform the functions of the system. All or part of the system may be implemented as, special purpose logic circuitry, e.g., an FPGA (field programmable gate array) and/or an ASIC (application-specific integrated circuit). In some examples, digital logic circuitry, e.g., one or more FPGAs, can be operative as a processor as described herein.

Accordingly, embodiments of the inventive subject matter can afford various benefits relative to prior art techniques. For example, embodiments and examples of the present disclosure can enable or facilitate e.g., lidar systems and components achieving or obtaining an Application Safety Integration Level (ASIL) in accordance with a safety standard such as ISO 26262. Embodiments and examples of the present disclosure can provide a current sensor that calibrates itself automatically thanks to a model of the system and to an adequate number of magnetic field measurements in the vicinity of the conductor. Embodiments and examples of the present disclosure can provide a calibration can be done through, e.g., an algorithm, a coupling-factor ratio, or by solving the system of equations. The model can be or include, e.g., a look-up table, a polynomial interpolation, or a numerical model. In running mode, the calibration procedure can be run in the background to check if anything has changed in the system: this can be used as a diagnostic purpose. The current sensor can calibrate itself, from the knowledge of the current. The current sensor can be triggered externally to launch the auto-calibration.

Various embodiments of the concepts, systems, devices, structures, and techniques sought to be protected are described above with reference to the related drawings. Alternative embodiments can be devised without departing from the scope of the concepts, systems, devices, structures, and techniques described. For example, while refence is made above to a current sensor IC with a single set of magnetic field sensing elements, other examples and implementations may include multiple sets or constellations of magnetic field sensing elements at any desired distance from a processor or IC associated with the sensor. The corresponding system model could include the positions of the multiple sets or constellations of magnetic field sensing elements.

It is noted that various connections and positional relationships (e.g., over, below, adjacent, etc.) may be used to describe elements and components in the description and drawings. These connections and/or positional relationships, unless specified otherwise, can be direct or indirect, and the described concepts, systems, devices, structures, and techniques are not intended to be limiting in this respect. Accordingly, a coupling of entities can refer to either a direct or an indirect coupling, and a positional relationship between entities can be a direct or indirect positional relationship.

As an example of an indirect positional relationship, positioning element "A" over element "B" can include situations in which one or more intermediate elements (e.g., element "C") is between elements "A" and elements "B" as long as the relevant characteristics and functionalities of elements "A" and "B" are not substantially changed by the intermediate element(s).

Also, the following definitions and abbreviations are to be used for the interpretation of the claims and the specification. The terms "comprise," "comprises," "comprising," "include," "includes," "including," "has," "having," "contains" or "containing," or any other variation are intended to cover a non-exclusive inclusion. For example, an apparatus, a method, a composition, a mixture, or an article, that includes a list of elements is not necessarily limited to only those elements but can include other elements not expressly listed or inherent to such apparatus, method, composition, mixture, or article.

Additionally, the term "exemplary" means "serving as an example, instance, or illustration. Any embodiment or design described as "exemplary" is not necessarily to be construed as preferred or advantageous over other embodiments or designs. The terms "one or more" and "at least one" indicate any integer number greater than or equal to one, i.e., one, two, three, four, etc. The term "plurality" indicates any integer number greater than one. The term "connection" can include an indirect "connection" and a direct "connection".

References in the specification to "embodiments," "one embodiment, "an embodiment," "an example embodiment," "an example," "an instance," "an aspect," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it may affect such feature, structure, or characteristic in other embodiments whether explicitly described or not.

Relative or positional terms including, but not limited to, the terms "upper," "lower," "right," "left," "vertical," "horizontal, "top," "bottom," and derivatives of those terms relate to the described structures and methods as oriented in the drawing figures. The terms "overlying," "atop," "on top, "positioned on" or "positioned atop" mean that a first element, such as a first structure, is present on a second element, such as a second structure, where intervening elements such as an interface structure can be present between the first element and the second element. The term "direct contact" means that a first element, such as a first structure, and a second element, such as a second structure, are connected without any intermediary elements.

Use of ordinal terms such as "first," "second," "third," etc., in the claims to modify a claim element does not by itself connote any priority, precedence, or order of one claim element over another, or a temporal order in which acts of a method are performed, but are used merely as labels to distinguish one claim element having a certain name from another element having a same name (but for use of the ordinal term) to distinguish the claim elements.

The terms "approximately" and "about" may be used to mean within ±20% of a target value in some embodiments, within plus or minus (±) 10% of a target value in some embodiments, within ±5% of a target value in some embodiments, and yet within ±2% of a target value in some embodiments. The terms "approximately" and "about" may include the target value. The term "substantially equal" may be used to refer to values that are within ±20% of one another in some embodiments, within ±10% of one another in some embodiments, within ±5% of one another in some embodiments, and yet within ±2% of one another in some embodiments.

The term "substantially" may be used to refer to values that are within ±20% of a comparative measure in some embodiments, within ±10% in some embodiments, within ±5% in some embodiments, and yet within ±2% in some embodiments. For example, a first direction that is "substantially" perpendicular to a second direction may refer to a first direction that is within ±20% of making a 90° angle with the second direction in some embodiments, within ±10% of making a 90° angle with the second direction in some embodiments, within ±5% of making a 90° angle with the second direction in some embodiments, and yet within ±2% of making a 90° angle with the second direction in some embodiments.

The disclosed subject matter is not limited in its application to the details of construction and to the arrangements of the components set forth in the following description or illustrated in the drawings. The disclosed subject matter is capable of other embodiments and of being practiced and carried out in various ways.

Also, the phraseology and terminology used in this patent are for the purpose of description and should not be regarded as limiting. As such, the conception upon which this disclosure is based may readily be utilized as a basis for the designing of other structures, methods, and systems for carrying out the several purposes of the disclosed subject matter. Therefore, the claims should be regarded as including such equivalent constructions as far as they do not depart from the spirit and scope of the disclosed subject matter.

Although the disclosed subject matter has been described and illustrated in the foregoing exemplary embodiments, the present disclosure has been made only by way of example. Thus, numerous changes in the details of implementation of the disclosed subject matter may be made without departing from the spirit and scope of the disclosed subject matter.

Accordingly, the scope of this patent should not be limited to the described implementations but rather should be limited only by the spirit and scope of the following claims.

All publications and references cited in this patent are expressly incorporated by reference in their entirety.

What is claimed is:

1. An auto-calibrating current sensor configured for calibration at a mounted position relative to a given conductor, the sensor comprising:
  a. a plurality of magnetic field sensing elements disposed at different locations within an integrated circuit (IC), respectively, and configured to produce a plurality of linearly independent magnetic field measurements of a magnetic field produced by a current carried by the conductor;
  b. memory comprising computer-executable instructions, wherein the computer-executable instructions include an electromagnetic model of the integrated circuit and the conductor, and wherein the model is operative to determine a magnetic field at points in space due to a given current in the conductor; and c. a processor coupled to the memory and operative to execute the computer-executable instructions, wherein, in response to executing the computer-executable instructions, the processor is configured to:

receive the plurality of linearly independent magnetic field measurements from the plurality of magnetic field sensing elements;

from the electromagnetic model, determine a plurality of coupling factors between the plurality of magnetic field sensing elements at their respective locations and the conductor, wherein each coupling factor is indicative of a magnitude of magnetic field measured per unit of current in the conductor;

based on the plurality of coupling factors and plurality of linearly independent magnetic field measurements, calculate the current applied to the conductor; and based on the plurality of coupling factors and plurality of linearly independent magnetic field measurements, calculate the position of the integrated circuit at the mounted position relative to the conductor;

wherein the current sensor is calibrated at the mounted position to determine current flowing in the conductor.

2. The current sensor of claim 1, wherein the processor is configured to calculate the position of the integrated circuit as a distance across an airgap between the conductor and the integrated circuit.

3. The current sensor of claim 1, wherein the model includes the position and orientation of the magnetic field sensing elements of the integrated circuit relative to each other.

4. The current sensor of claim 1, wherein the model comprises a three-dimensional (3D) electromagnetic finite-element-method (FEM) model.

5. The current sensor of claim 1, wherein the model comprises a lookup table having coupling factor values corresponding to a range of distances between the integrated circuit and the conductor.

6. The current sensor of claim 5, wherein the coupling factor values comprise coupling factors for corresponding distances, respectively, for different linear combinations of the magnetic field sensing elements.

7. The current sensor of claim 6, wherein a linear combination comprises a differential measurement between two magnetic field sensing elements.

8. The current sensor of claim 1, wherein the model comprises a system of non-linear equations expressing a coupling factor based on one or more distances between the conductor and the integrated circuit.

9. The current sensor of claim 8, wherein the processor is configured to determine the coupling factors by interpolation between the non-linear equations.

10. The current sensor of claim 8, wherein the non-linear equations comprise polynomials.

11. The current sensor of claim 10, wherein the polynomials each express a coupling factor between the conductor and one of the magnetic field sensing elements as a function of a distance between the integrated circuit and the conductor.

12. The current sensor of claim 1, wherein each of the plurality of magnetic field sensing elements has an axis of maximum sensitivity.

13. The current sensor of claim 12, wherein one or more of the magnetic field sensing elements is configured such that the axis of maximum sensitivity is perpendicular to a planar surface of the IC.

14. The current sensor of claim 12, wherein one or more of magnetic field sensing elements is configured such that the axis of maximum sensitivity is parallel to a planar surface of the IC.

15. The current sensor of claim 1, wherein the plurality of magnetic field sensing elements comprises one or more Hall effect elements.

16. The current sensor of claim 1, wherein the plurality of magnetic field sensing elements comprises one or more magnetoresistance elements.

17. The current sensor of claim 1, wherein the plurality of magnetic field sensing elements comprises one or more fluxgate elements.

18. The current sensor of claim 1, wherein the processor is configured to realize linear combinations of the magnetic field measurements from the plurality of magnetic field sensing elements.

19. The current sensor of claim 1, wherein the IC comprises a first IC, and further comprising a second IC separate from the first IC, wherein the second IC includes a second plurality of magnetic field sensing elements disposed at different positions, respectively, and configured to measure a magnetic field produced by a current carried in the conductor.

* * * * *

UNITED STATES PATENT AND TRADEMARK OFFICE
CERTIFICATE OF CORRECTION

PATENT NO. : 11,885,866 B2
APPLICATION NO. : 17/804647
DATED : January 30, 2024
INVENTOR(S) : Yannick Vuillermet et al.

Page 1 of 1

It is certified that error appears in the above-identified patent and that said Letters Patent is hereby corrected as shown below:

In the Specification

Column 3, Line 30, delete "M is N." and replace with --M is $\geq$ N.--.

Column 3, Line 65-66, delete "M is N." and replace with --M is $\geq$ N.--.

Column 7, Line 19, delete "M is N." and replace with --M is $\geq$ N.--.

Column 9, Line 50, delete "|B3$^{MES}$" and replace with --|B3$_{MES}$--.

Column 10, Line 50, delete "AG+6." and replace with --AG+$\delta$.--.

Signed and Sealed this
Eighteenth Day of February, 2025

Coke Morgan Stewart
*Acting Director of the United States Patent and Trademark Office*